United States Patent
Wagenleitner et al.

(10) Patent No.: US 11,101,132 B2
(45) Date of Patent: Aug. 24, 2021

(54) METHOD AND DEVICE FOR BONDING OF SUBSTRATES

(71) Applicant: EV Group E. Thallner GmbH, St. Florian am Inn (AT)

(72) Inventors: Thomas Wagenleitner, Aurolzmunster (AT); Andreas Fehkuhrer, Senftenbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/880,139

(22) Filed: May 21, 2020

(65) Prior Publication Data

US 2020/0286733 A1 Sep. 10, 2020

Related U.S. Application Data

(63) Continuation of application No. 16/809,651, filed on Mar. 5, 2020, now Pat. No. 10,755,930, which is a continuation of application No. 16/074,271, filed as application No. PCT/EP2016/053268 on Feb. 16, 2016, now Pat. No. 10,755,929.

(51) Int. Cl.
*H01L 21/20* (2006.01)
*H01L 21/67* (2006.01)
*B81C 1/00* (2006.01)

(52) U.S. Cl.
CPC ...... *H01L 21/2007* (2013.01); *B81C 1/00269* (2013.01); *H01L 21/67092* (2013.01)

(58) Field of Classification Search
CPC .................................................. H01L 21/20
See application file for complete search history.

(56) References Cited

U.S. PATENT DOCUMENTS

| | | |
|---|---|---|
| 4,503,335 A | 3/1985 | Takahashi |
| 5,273,553 A | 12/1993 | Hoshi et al. |
| 5,769,991 A | 6/1998 | Miyazawa et al. |
| 6,451,670 B1 | 9/2002 | Takisawa et al. |
| 6,666,928 B2 | 12/2003 | Worm |

(Continued)

FOREIGN PATENT DOCUMENTS

| | | |
|---|---|---|
| CN | 1209644 A | 3/1999 |
| DE | 10 2004 058 456 A1 | 6/2006 |

(Continued)

OTHER PUBLICATIONS

International Search Report from corresponding International Patent Application No. PCT/EP2016/053268, dated Oct. 19, 2016.

(Continued)

*Primary Examiner* — Marvin Payen
(74) *Attorney, Agent, or Firm* — Kusner & Jaffe

(57) ABSTRACT

A method and device for bonding a first substrate with a second substrate inside a sealed bonding chamber. The method includes: a) fixing of the first and second substrates, b) arranging of the first and second substrates, c) mutual approaching of the first and second substrates, d) contacting the first and second substrates at respective bond initiation points, e) generating a bonding wave running from the bond initiation points to side edges of the substrates, and f) influencing the bonding wave during course of the bonding wave, wherein targeted influencing of the bonding wave takes place by a regulated and/or controlled change of pressure inside the bonding chamber.

8 Claims, 5 Drawing Sheets

(56) References Cited

U.S. PATENT DOCUMENTS

Figure 2A:
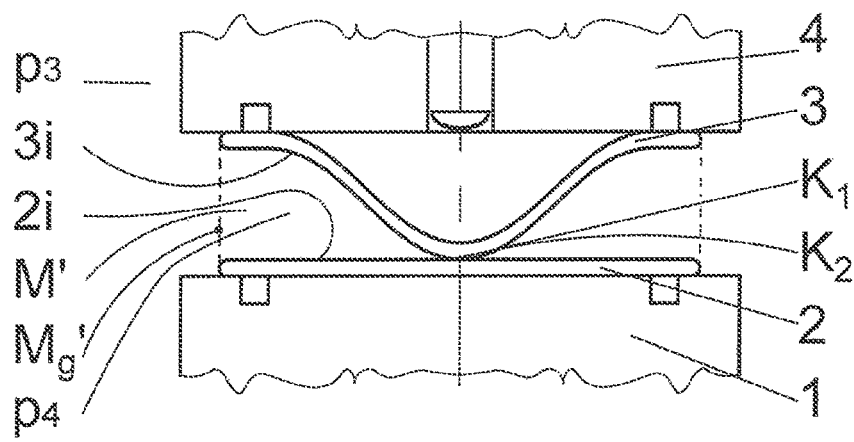

| | | |
|---|---|---|
| 7,230,204 B2 | 6/2007 | Mitrovic et al. |
| 7,682,933 B1 | 3/2010 | Loomis |
| 8,475,612 B2 | 7/2013 | Gaudin |
| 8,640,548 B2 | 2/2014 | Wimplinger |
| 9,123,631 B2 | 9/2015 | Gaudin |
| 9,312,161 B2 | 4/2016 | Wimplinger et al. |
| 9,646,860 B2 | 5/2017 | Huang et al. |
| 9,818,614 B2 | 11/2017 | Gaudin |
| 2003/0159307 A1 | 8/2003 | Sago et al. |
| 2006/0105106 A1 | 5/2006 | Balseanu et al. |
| 2007/0007276 A1 | 1/2007 | Steger |
| 2007/0087531 A1 | 4/2007 | Kirk et al. |
| 2008/0200008 A1 | 8/2008 | Kerdiles et al. |
| 2009/0110805 A1 | 4/2009 | Kaeppeler et al. |
| 2012/0077329 A1 | 3/2012 | Broekaart et al. |
| 2012/0196242 A1 | 8/2012 | Volfovski et al. |
| 2015/0044786 A1 | 2/2015 | Huang et al. |
| 2015/0210057 A1 | 7/2015 | Wagenleithner et al. |
| 2015/0228521 A1 | 8/2015 | Wimplinger et al. |
| 2017/0203377 A1 | 7/2017 | Yokoyama et al. |
| 2017/0243853 A1 | 8/2017 | Huang et al. |

FOREIGN PATENT DOCUMENTS

| | | |
|---|---|---|
| EP | 2 405 465 A1 | 1/2012 |
| EP | 2 418 678 A2 | 2/2012 |
| EP | 2 463 892 A1 | 6/2012 |
| JP | H07-226350 A | 8/1995 |
| JP | 2008-168413 A | 7/2008 |
| JP | WO-2010-018621 A1 | 2/2010 |
| JP | 2010-114397 A | 5/2010 |
| JP | 4885235 B2 | 2/2012 |
| JP | 2013-191789 A | 9/2013 |
| JP | 5355043 B2 | 11/2013 |
| TW | 0582070 B | 4/2004 |
| TW | 200423215 A | 11/2004 |
| TW | 200625447 A | 7/2006 |
| WO | WO-2010/018621 A1 | 2/2010 |
| WO | WO-2012/083978 A | 6/2012 |
| WO | WO-2013/137002 A1 | 9/2013 |
| WO | WO-2015/175339 A1 | 11/2015 |
| WO | WO-2016/104710 A1 | 6/2016 |

OTHER PUBLICATIONS

PCT Preliminary Examination Report from corresponding International Patent Application No. PCT/EP2016/053268, dated Jun. 27, 2018.

Mack, Chris, *Fundamental Principles of Optical Lithography: The Science of Microfabrication*, John Wiley & Sons, Ltd., pp. 314-323, 2007, Reprint 2012.

http://commons.wikimedia.org/wiki/File:Overlay_typical_model_terms_DE.svg, May 24, 2013.

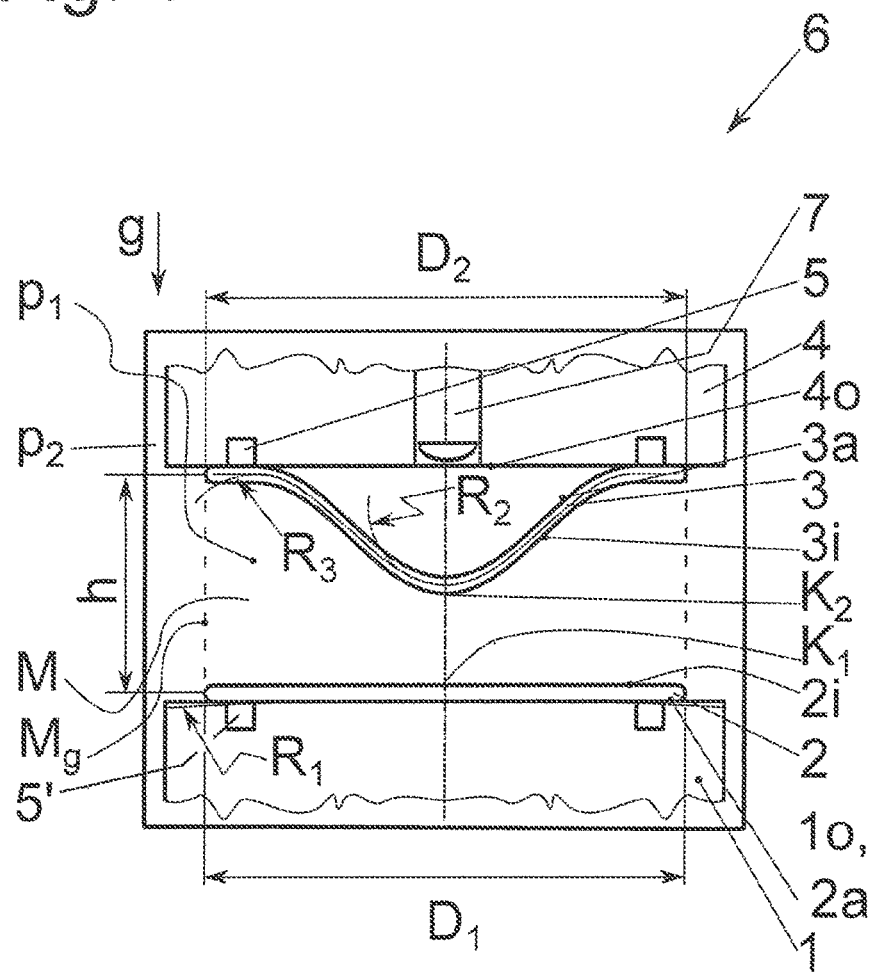

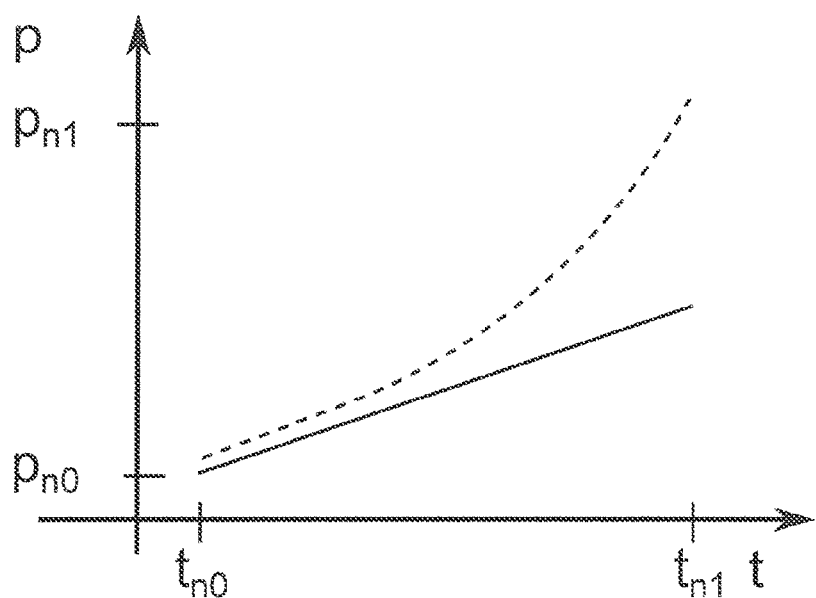

METHOD AND DEVICE FOR BONDING OF SUBSTRATES

RELATED APPLICATIONS

This application is a continuation of U.S. application Ser. No. 16/809,651, filed Mar. 5, 2020, which is a continuation of U.S. application Ser. No. 16/074,271, filed Jul. 31, 2018, which is a U.S. National Stage Application of PCT/EP2016/053268 filed Feb. 16, 2016, said patent applications hereby fully incorporated herein by reference.

FIELD OF THE INVENTION

The invention relates to a method and a device for bonding a first substrate with a second substrate.

BACKGROUND OF THE INVENTION

The progressive miniaturisation in almost all areas of microelectronics and microsystem technology requires constant development of all technologies with the aid of which the density of all kinds of functional units on substrates can be increased. These functional units include for example microcontrollers, memory chips, MEMS, all kinds of sensors or microfluidic components.

The technologies for increasing the lateral density of these functional units have been greatly improved in recent years. In some sub-sectors of microelectronics or microsystem technology, even to an extent such that a further increase in the lateral density of the functional units is no longer possible. In microchip production, the maximum achievable resolution limit for the structures to be produced lithographically has as good as already been reached. In a few years, therefore, physical and technological limitations will no longer permit any increase at all in the lateral density of functional units. For a number of years now, the industry has confronted this problem by the development of 2.5D and 3D technologies. With the aid of these technologies it is possible for identical, or even differently formed functional units to be aligned with one another, to be stacked upon one another, to bond them permanently with one another and to cross-link them with one another by suitable strip conductors.

One of the key technologies for producing such structures is permanent bonding. Permanent bonding is understood to mean all methods with the aid of which substrates can be bonded together in such a way that their separation is possible only by a high expenditure of energy and an associated destruction of the substrates. There are various kinds of permanent bonding, such as are known to the person skilled in the art.

One of the most important permanent bonding methods is fusion bonding, also referred to as direct bonding or molecular bonding. Fusion bonding is understood to mean the two-stage process of permanently bonding two substrates. In the first stage, also referred to as the pre-bond, the substrates are fixed together by relatively weak atomic forces such as the van der Waals forces and in the second stage are bonded together in a molecular and/or atomic manner by the formation of covalent bonds. Fusion bonds arise mainly at the surfaces of non-metallic inorganic materials.

The bonding strength created by the pre-bond suffices however to transport the two substrates without a displacement of the substrates with respect to one another being caused. Thus, although the bonding strength between the two substrates is certainly sufficient to transport the substrates stack without problem, the bonding strength is so small that a renewed, destruction-free separation of the two substrates can take place with special devices. This has the decisive advantage that, after a pre-bond, the structures of these two structures can be measured and their relative positions, distortions and orientations can be determined. If it is ascertained during the measuring procedure that a misorientation and/or a local and/or total distortion of the structures is present or particles are present in the interface, the substrate stack can again be duly separated and reprocessed. Following a successful and above all verified pre-bond, the actual permanent bond is produced by heat treatment processes. During the treatment process, a chemical and/or physical strengthening of the bonding of the surfaces of the two substrates arises due to the supply of the thermal energy. This permanent bond is irreversible in the sense that a destruction-free separation of the two substrates is no longer possible. Mention will only be made generally of a bond in the subsequent text and an explicit distinction between pre-bond and permanent bond will no longer be made.

The most common fusion bonds are carried out on silicon and silicon oxide substrates. As a result of its semiconductor properties, silicon often serves as a base material for the production of microelectronic components such as microchips and memories. A so-called direct bond can also arise between highly polished or lapped metal surfaces or with flat glass surfaces. The underlying bonding properties indeed differ from those of a fusion bond, but the mechanism by which the two surfaces make contact with one another by the progressive bonding wave can however be described by the same physics. The bonding of two hybrid surfaces by a so-called hybrid bond would also be conceivable. A hybrid surface is understood to mean a surface comprising at least two different materials. One of the two materials is usually limited to a small space, while the second material surrounds the first material. For example, metal contacts are surrounded by dielectrics. In the production of a hybrid bond by the bonding of two hybrid surfaces, the bonding wave is driven primarily by the fusion bonding between the dielectrics, whereas the metal contacts automatically find themselves together as a result of the bonding wave. Examples of dielectrics and low-k materials are Non-silicon-based
    Polymers
        Polyimides
        Aromatic polymers
        Parylene
        PTFE
    Amorphous carbon
    Silicon-based
    Silicate-based
        TEOS (tetraethyl orthosilicate)
        SiOF
        SiOCH
        Glasses (borosilicate glasses, alumosilicate glasses, lead silicate glasses, alkali silicate glasses, etc.)
    General
        $Si_3N_4$
        SiC
        $SiO_2$
        SiCN
    Silesquioxanes
        HSSQ
        MSSQ One of the greatest technical problems with the permanent bonding of two substrates is the alignment accuracy of the functional units between the individual substrates. Although the substrates can be precisely aligned with respect to one another by means of alignment equipment, distortions of the substrates can arise during the bonding process itself. As a result of the distortions thus arising, the functional units will not necessarily be correctly aligned with one another at all positions. The alignment inaccuracy at a specific point on the substrate may be a result of a distortion, a scaling error, a lens error (magnification or reduction error) etc. In the semiconductor industry, all subject areas dealing with such problems are combined under the term "overlay". A suitable introduction to this subject can be found for example in: Mack, Chris. *Fundamental Physics of Optical Lithography—The Science of Microfabrication*. WILEY, 2007, Reprint 2012.

Each functional unit is usually designed in the computer before the actual production process. For example, strip conductors, microchips, MEMS, or any other structure producible with the aid of microsystem technology, are designed in a CAD (Computer aided Design) program. During the production of the functional units, it can however be seen that there is always a deviation between the ideal functional units designed on the computer and the real functional units produced in the clean room. The differences are primarily due to natural variations in the materials used, such as for example different number of the different isotopes in the substrate material, limitations of the hardware, i.e. engineering-related problems, but very often physical limitations. Thus, the resolution accuracy of a structure that is produced by a photolithographic process is limited by the size of the apertures of the photomask and the wavelength of the light used. Mask distortions are directly transferred to the photoresist. Drives, (linear) motors and positioning devices of machines produced with these components can only approach reproducible positions within a given tolerance, etc. It is not therefore surprising that the functional units of a substrate cannot be identical to the structures designed on the computer. Even before the bonding process, all substrates thus have a non-negligible divergence from the ideal state.

If the positions and/or shapes of two opposite-lying functional units of two substrates are compared on the assumption that neither of the two substrates is distorted by a bonding process, it is found that in general there is already an imperfect congruence of the functional units, since the latter diverge from the ideal computer model due to the errors described above. The most frequent errors are represented in figure XX (Copied from: http://commons.wikimedia.org/wiki/File:Overlay-_typical_model_terms_DE.svg, 24.05.2013 and Mack, Chris. *Fundamental Principles of Optical Lithography—The Science of Microfabrication*. Chichester: WILEY, p. 312, 2007, Reprint 2012). According to the illustrations, a rough distinction can be made between overall and local as well as symmetrical and asymmetrical overlay errors. An overall overlay error is homogeneous, therefore independent of location. It produces the same divergence between two opposite-lying functional units irrespective of the position. The conventional overall overlay errors are errors I. and II., which arise due to a translation or rotation of the two substrates with respect to one another. The translation or rotation of the two substrates produces a corresponding translational or rotational error for all the functional units lying respectively opposite one another on the substrates. A local overlay error arises in a location-dependent manner, mainly due to elasticity and/or plasticity problems, in the present case primarily caused by the continuously propagating bonding wave. Of the represented overlay errors, errors III. and IV. are in particular referred to as "run-out" errors. This error arises primarily due to a distortion of at least one substrate during a bonding process. As a result of the distortion of at least one substrate, the functional units of the first substrate are also distorted in respect of the functional units of the second substrate. Errors I. and II. can however also arise due to a bonding process, but they are usually superimposed by errors III. and IV. to such a marked extent that it is difficult to detect or measure them.

There is already a device in the prior art, with the aid of which local distortions can be reduced at least partially. It concerns here a local distortion due to the use of active control elements (WO2012/083978A1).

Initial approaches to a solution for correcting "run-out" errors exist in the prior art. US20120077329A1 describes a method for obtaining a desired alignment accuracy between the functional units of two substrates during and after the bonding, whereby the lower substrate is not fixed. The lower substrate is thus not subjected to any boundary conditions and can bond freely to the upper substrate during the bonding process. An important feature in the prior art is, in particular, the flat fixing of a substrate, usually by means of a vacuum device.

In most cases, the arising "run-out" errors become more intensified radially symmetrical around the contact point, from which reason they increase from the contact point to the periphery. In most cases, it involves a linearly increasing intensification of the "run-out" errors. Under special conditions, the "run-out" errors can also increase non-linearly.

Under particularly optimum conditions, the "run-out" errors can be ascertained not only by suitable measuring devices (EP2463892), but can also be described by mathematical functions. Since the "run-out" errors represent translations and/or rotations and/or scaling between well-defined points, they are preferably described by vector functions. Generally, this vector function is a function $f:R^2 \rightarrow R^2$, i.e. a mapping rule, which maps the two-dimensional definition range of the position coordinates onto the two-dimensional value range of "run-out" vectors. Although an exact mathematical analysis of the corresponding vector fields has not yet been able to be carried out, assumptions are made concerning the function properties. The vector functions are, with a high degree of probability, at least $C^n n >= 1$ functions, i.e. at least continuously differentiable. Since the "run-out" errors increase from the contact point to the edge, the divergence of the vector function will probably be different from zero. With a high degree of probability, therefore, the vector field is a source field.

SUMMARY OF THE INVENTION

The present invention overcomes problems of the prior art to provide a device and a method for bonding two substrates, with which the bonding quality, in particular the bonding accuracy, especially at the edge of the substrates, is increased.

The problems of the prior art are solved with the features of the coordinated claims. Advantageous developments of the invention are given in the sub-claims. All combinations of at least two features given in the description, in the claims and/or the drawings also fall within the scope of the invention. In the stated value ranges, values lying inside the stated limits are also deemed to be disclosed as limiting values and can be claimed in any combination.

The idea underlying the invention is that, during the bonding, in particular during the course of a bonding wave, preferably in the case of fusion bonding, this bonding wave is influenced.

Influencing is understood in particular to mean a targeted, active change and/or control of an initial state of at least one parameter. These parameters can in particular be gas composition, water content, pressure, temperature of the surroundings and/or of the medium in which the bonding wave runs, in particular a bonding chamber vacuum or atmosphere, adjustment/change in the shape of the substrates and/or their fixing relationship and/or their spacing.

According to the invention, a method is provided for the bonding, preferably permanent bonding, in particular fusion bonding, of a first substrate with a second substrate inside a sealed bonding chamber, comprising the following steps:
a) fixing of the substrates,
b) arrangement of the substrates,
c) mutual approach of the substrates,
d) contacting of the substrates at a bond initiation point,
e) generation of a bonding wave running from the bond initiation point to the side edges of the substrates and,
f) influencing of the bonding wave.

In a preferred embodiment, provision is made such that in step f) the targeted influencing of the bonding wave takes place by a regulated and/or controlled change of the pressure inside the bonding chamber. Particularly efficient influencing of the bonding wave is thus advantageously possible.

According to the invention, in particular as an independent subject-matter of the invention, a method is in particular provided for bonding, preferably permanent bonding, in particular fusion bonding, of a first substrate with a second substrate inside a sealed bonding chamber, comprising the following steps:
a) fixing of the substrates,
b) arrangement of the substrates,
c) mutual approach of the substrates,
d) contacting of the substrates at a bond initiation point,
e) generation of a bonding wave running from the bond initiation point to the side edges of the substrate, in particular by releasing the fixing of at least one of the substrates,
f) changing the pressure, in particular increasing the pressure, inside the bonding chamber for influencing the bonding wave, in particular a regulated and/or controlled change in pressure.

According to the invention, in particular as an independent subject-matter of the invention, a method is in particular provided for bonding, preferably permanent bonding, in particular fusion bonding, of a first substrate with a second substrate inside a bonding chamber, comprising the following steps:
a) fixing of the substrates,
b) arrangement of the substrates,
c) mutual approach of the substrates,
d) contacting of the substrates at a bond initiation point,
e) maintaining the fixing of at least one of the substrates and regulated approach of the substrates towards one another, as a result generating a bonding wave running from the bond initiation point to the side edges of the substrates,
f) a regulated and/or controlled change in the spacing of the substrates for influencing the bonding wave.

In a preferred embodiment, provision is made such that in step e) the fixing of at least one of the substrates is maintained and the substrates are caused to approach one another in a regulated manner and the bonding wave is thus generated, and in step f) the influencing of the bonding wave by a regulated and/or controlled change in the spacing of the substrates takes place. Particularly efficient influencing of the bonding wave is thus advantageously possible.

According to a preferred embodiment, provision is made such that the pressure change amounts to more than 1 mbar/s, preferably more than 10 mbar/s, more preferably more than 100 mbar/s, still more preferably more than 500 mbar/s, again more preferably more than 1000 mbar/s, most preferably more than 2000 mbar/s. Particularly efficient influencing of the bonding wave is thus advantageously possible.

According to another preferred embodiment, provision is made such that the bonding wave is influenced in such a way that the speed of the bonding wave is in particular retarded by more than 0.1 cm/s, preferably by more than 1 cm/s, more preferably by more than 10 cm/s, particularly preferably more than 100 cm/s, in the still more preferred case by more than 200 cm/s, in the most preferred case by more than 1000 cm/s. Particularly efficient influencing of the bonding wave is thus advantageously possible.

According to another preferred embodiment, provision is made such that the pressure is measured with sensors inside the bonding chamber and the change in pressure is controlled depending on the measured values. A particularly precise control of the change in pressure is thus advantageously possible.

In a preferred embodiment, the change in pressure takes place by means of a mobile piston, wherein the piston reduces the volume of the bonding chamber. Alternatively and/or in addition, the change in pressure takes place by means of a heating and/or cooling device, wherein the heating and/or cooling device changes, in particular increases, the temperature inside the bonding chamber. Alternatively or in addition, the change in pressure takes place by means of a pump, wherein the pump pumps a gas and/or a gas mixture into the bonding chamber and/or sucks the latter out of the bonding chamber. Alternatively and/or in addition, for the purpose of changing the pressure, gas and/or a gas mixture is conveyed from a pressure vessel via a valve into the bonding chamber and/or pressure is balanced in a vacuum vessel.

According to a preferred embodiment, provision is made such that, for the purpose of changing the pressure, a gas and/or gas mixture passes via at least one, preferably at least two, particularly preferably at least three, very particularly preferably at least five, still more preferably at least seven, most preferably at least ten nozzles, in particular slit nozzles. Particularly efficient influencing of the bonding wave is thus advantageously possible.

Another subject-matter of the present invention relates to an article, comprising two substrates, wherein the substrates have been bonded using a method according to one of the preceding embodiments.

Another subject-matter of the present invention relates to a device for the bonding, preferably permanent bonding, in particular fusion bonding, of a first substrate with a second substrate, in particular using a method according to one of the preceding embodiments, comprising:
a) a bonding chamber,
b) holding devices for holding and fixing the substrates, wherein the holding devices are constituted for the mutual approach of the substrates, for contacting of the substrates and for generating a bonding wave,
c) influencing means for influencing the bonding wave.

In a preferred embodiment, provision is made such that the influencing means comprise pressure-changing means for changing the pressure inside the bonding chamber for influencing the bonding wave. Particularly efficient influencing of the bonding wave is thus advantageously possible.

In a preferred embodiment, provision is made such that the influencing means comprise spacing-changing means for changing the spacing of the substrates for influencing the bonding wave. Particularly efficient influencing of the bonding wave is thus advantageously possible.

Another, in particular independent, subject-matter of the present invention relates to a device for the bonding, preferably permanent bonding, in particular fusion bonding, of a first substrate with a second substrate, in particular using a method according to one of the preceding embodiments, comprising:
 a) a bonding chamber,
 b) holding devices for holding and fixing the substrates, wherein the holding devices are constituted for the mutual approach of the substrates, for contacting of the substrates and for generating a bonding wave, in particular by releasing the fixing of at least one of the substrates,
 c) pressure-changing means for changing the pressure inside the bonding chamber, in particular pressure-increasing means, for influencing the bonding wave.

Another, in particular independent, subject-matter of the present invention relates to a device for the bonding, preferably permanent bonding, in particular fusion bonding, of a first substrate with a second substrate, in particular using a method according to one of the preceding embodiments, comprising:
 a) a bonding chamber,
 b) holding devices for holding and fixing the substrates, wherein the holding devices are constituted for the mutual approach of the substrates, for contacting of the substrates and for generating a bonding wave,
 c) spacing-changing means for changing the spacing of the substrates for influencing the bonding wave.

The bonding is initiated by contact being made between the contact faces in a manner known to the person skilled in the art. Suitable bonding means are in particular provided in accordance with the device.

In the initial state, the substrates are usually more or less flat, in particular on a contact face, apart from any structures projecting above the contact face (microchips, functional components) and substrate tolerances such as bending and/or thickness fluctuations. In the initial state, however, the substrates in most cases have a curvature differing from zero. Curvatures of less than 50 µm are common for 300 mm wafers. In mathematical terms, a curvature of can be regarded as a measure of the local deviation of a curve from its plane state. In the specific case, substrates are considered, the thicknesses whereof are small compared to the diameter. To a good approximation, therefore, one can speak of the curvature of a plane. In the case of a plane, the initially mentioned flat state is the tangential plane of the curve at the point at which the curve is considered. Generally, a body, in the special case the substrate, does not have a homogeneous curvature, so that the curvature is an explicit function of the location. Thus, it may be, for example, that a non-flat substrate has a concave curvature in the centre, but at other points a convex curvature. In the simplest case, curvatures will always be described below only as concave or convex, without going into more precise mathematical details that are known to mathematicians, physicists and engineers.

An, in particular independent, core idea for most of the embodiments according to the invention is the fact that the curvature radii of the two substrates to be bonded together are the same at least in the contacting region of the substrates, i.e. at a bond front of the bonding wave or at the bonding line, or at least diverge only marginally from one another. The difference between the two curvature radii at the bond front/bonding line of the substrates is less than 10 m, preferably less than 1 m, more preferably less than 1 cm, most preferably less than 1 mm, most preferably of all less than 0.01 mm, again most preferably less than 1 µm. Generally, all the embodiments according to the invention that minimise the curvature radius are advantageous. In other words: The invention relates to a method and a plant, with the aid of which it is possible to bond two substrates together in such a way that their local alignment errors, which are referred to as "run-out" errors, are minimal.

Furthermore, the invention is based on the idea of controlling the two substrates to be bonded together, in particular by geometrical, thermodynamic, fluid-dynamic and/or mechanical compensation mechanisms, in such a way that the influencing factors on the developing bonding wave are selected such that the two substrates are not locally displaced with respect to one another during the bonding, i.e. are correctly aligned. Furthermore, the invention describes an article, comprising two substrates bonded together with a reduced "run-out" error according to the invention.

The characteristic process according to the invention during the bonding, in particular permanent bonding, preferably fusion bonding, is the most concentric, point-like possible contacting of the two substrates. Generally, the contacting of the two substrates can also take place in a non-concentric manner. The bonding wave being propagated from a non-concentric contact point would reach different sides of the substrate edge at different times. The complete mathematical-physical description of the bonding wave behaviour and of the resultant "run-out" error compensation would be correspondingly complicated. Generally, however, the contacting point will not lie far from the centre of the substrate, so that the effects possibly resulting therefrom are negligible at least at the edge. The distance between a possible non-concentric contacting point and the centre of the substrate is less than 150 mm, preferably less than 10 mm, more preferably less than 1 mm, most preferably less than 0.1 mm, most preferably of all less than the 0.01 mm. In the rest of the description, contacting should as a rule be understood to mean concentric contacting. In the broader sense, centre is preferably understood to mean the geometrical centre-point of a basic ideal body, if necessary compensated for asymmetries. In the case of wafers standard in the industry with a notch (notch for signalling the crystal plane), the centre is therefore the circle centre-point of the circle that surrounds the ideal wafer without a notch. In the case of wafers standard in the industry with a flat (flattened side), the centre is the circle centre-point of the circle that surrounds the ideal wafer without a flat. Analogous considerations apply to arbitrarily shaped substrates.

For the start of a bonding wave, the substrates have to be brought into contact by means of a translational approach, in particular in a concentric, point-like manner. Any arbitrary contact point is however possible in theory.

In special embodiments, however, it may be useful to understand the centre to mean the centre of gravity of the substrate.

The upper substrate of at least one of the two substrates will, on account of gravitation, preferably have an impressed curvature in the direction of the other substrate and, during the aforementioned translational approach, will therefore automatically make contact with a sufficiently small spacing from the corresponding second substrate.

After the contacting of the centres of the two substrates has taken place, the fixing of the upper substrate holder can be released. The upper substrate drops down, on the one hand due to gravity and on the other hand due to a bonding force acting along the bonding wave and between the substrates. The upper substrate is bonded to the lower substrate radially from the centre to the side edge. A formation of a radially symmetrical bonding wave according to the invention thus arises, which runs in particular from the centre to the side edge. During the bonding process, the two substrates compress the gas, in particular air, present between the substrates ahead of the bonding wave and thus ensure a bonding interface without gas inclusions. The upper substrate virtually lies on a kind of gas cushion during the descent.

The invention is based on the idea that the influencing of the bonding, in particular fusion bonding, is achieved by the influencing of the gas cushion, in particular by means of the counter-pressure principle. According to the invention, the force ratio between the attracting weak forces causing the pre-bond and the counter-force, which is generated by means of temperature, pressure, flow conditions or the effect of mechanical forces, is actively and dynamically influenced.

The first/upper substrate is not subject to any additional fixing after the initiation of the bond at a bond initiation point, i.e. it can move freely apart from the fixing at the bond initiation point and can also become distorted. As a result of the advancing bonding wave, the stress states arising at the bonding wave front and the prevailing geometrical boundary conditions, each circle segment, infinitesimally small especially with regard to its radial thickness, is subject to a distortion. Infinitesimally small circle segment is understood to mean a circle segment which can be used for mathematical calculations. The radial thickness of the circle segment can be less than 1 mm, preferably less than 100 µm, still more preferably less than 10 µm, most preferably less than 1 µm, most preferably of all less than 0.1 µm. Since, however, the substrates represent rigid bodies, the distortions add up as a function of the distance from the centre. This leads to "run-out" errors, which are intended to be eliminated by the method according to the invention and the device according to the invention.

The invention also relates to a method and a device for reducing or even completely preventing the "run-out" error between two bonded substrates during bonding, in particular by means of thermodynamic and/or mechanical and/or fluid-dynamic compensation mechanisms. Furthermore, the invention deals with a corresponding article, which is produced with the device according to the invention and the method according to the invention.

The first and/or second substrate is preferably radially symmetrical. Although the substrate can have any arbitrary diameter, the wafer diameter is in particular 1 inch, 2 inches, 3 inches, 4 inches, 5 inches, 6 inches, 8 inches, 12 inches, 18 inches or greater than 18 inches. The thickness of the first and/or second substrate lies between the 1 µm and 10000 µm, preferably between 10 µm and 1500 µm, more preferably between 100 µm and 1000 µm.

The thickness of the substrate stack lies between 1 µm and 10000 µm, preferably between 10 µm and 20 mm.

In preferred embodiments, a substrate can also have a rectangular shape or at least a shape diverging from the circular shape. In the subsequent text, a substrate will be understood to mean in particular a wafer.

In an embodiment according to the invention, the lower/first holding device is constituted such that the lower/first substrate is deformed in a targeted manner by heating and/or cooling means even before the contacting, in particular is laterally shrunk or stretched, and more precisely by an amount that is necessary in the subsequent contacting to compensate as well as possible, in the ideal case completely, for the arising "run-out" error.

Since the fixing of the lower/first substrate in this embodiment does not take place until after the corresponding deformation, no particular importance has to be attached to the thermal expansion coefficients of the lower/first substrate or the lower/first holding device.

In a further particular mode of procedure according to the invention, the contacting of the lower/first substrate takes place before a heating and/or cooling process. As a result of the fixing before the heating and/or cooling process, the lower/first substrate follows the thermal expansion of the lower/first holding device, so that its thermal expansion coefficient can be used to specify the (thermal) expansion of the substrate. Particularly preferably, the thermal expansion coefficients of the lower/first substrate and of the lower/first holding device are the same, so that no thermal stresses or at least small ones arise in the lower/first substrate during the heating and/or cooling process. According to the invention, it would also be conceivable for the thermal expansion coefficients to be different. In the case of different thermal expansion coefficients, the lower/first substrate will on average follow the thermal expansion of the lower/first holding device.

The temperature differences to be fixed between the first and second holding device amount to less than 20° C., preferably less than 10° C., more preferably less than 5° C., most preferably less than 2° C., most preferably of all less than 1° C. According to the invention, each holding device is heated through as homogeneously as possible. In particular, a temperature field is provided, the temperature difference whereof at two arbitrary points is less than 5° C., preferably less than 3° C., more preferably less than 1° C., most preferably less than 0.1° C., most preferably of all less than 0.05° C.

In a further embodiment, the first holding device is designed in such a way that the holding device can be deformed, in particular shrunk and/or stretched, in a targeted manner at the holding surface by mechanical actuating means. The first substrate fixed on the surface of the first holding device, on account of its small thickness relative to the holding device, is deformed along with the deformation of the holding device. The deformation of the holding device takes place with pneumatic and/or hydraulic and/or piezoelectric actuators, which have been arranged distributed around the substrate holding device, preferably radially symmetrical. At least three actuators, which are arranged with an angular spacing from one another of 120°, are required for a completely symmetrical, purely radial distortion. Preferably more than 5 actuators, more preferably more than 10 actuators, more preferably more than 20 actuators, most preferably more than 30 actuators, most preferably of all more than 50 actuators are used.

In a further embodiment according to the invention, the contact faces of the two substrates are bonded together in a vertical position. The task of this special embodiment is primarily in reducing the deformation of the wafers due to gravitation, in arranging said wafers preferably at least symmetrically, particularly preferably in completely preventing and/or compensating for a deformation due to gravitation. In the vertical position, the two substrates are curved towards the bond initiation point, in particular simultaneously, symmetrically with respect to the bond initiation point, each by means of an actuating means, in particular each by a pin, so that the convex surfaces can be contracted in the bond initiation point. The, in particular automatic, bonding process with a bonding wave is started by releasing and subsequent contacting of at least one of the substrates from the holding surface.

In a further embodiment according to the invention, at least one influencing factor on the propagation, in particular propagation speed, of the bonding wave, and/or at least one influencing factor on the alignment of the contact faces, is controlled. The bonding wave is controlled particularly with regard to its speed. The control of the speed takes place dynamically, in particular indirectly via the composition and/or the density and/or the temperature and/or the pressure of a gas in the atmosphere in which the bonding takes place.

In a further embodiment according to the invention, the fixing of the, in particular, upper substrate holder can be maintained after the contacting of the centres of the two substrates. Accordingly, the bonding wave or its propagation can be changed and/or stopped by the influence of the spacing of the substrates from one another. Reproducible influencing of the bonding wave is thus possible by controlling the spacing.

The embodiments according to the invention are preferably implemented in a defined, in particular controllable and/or regulatable, atmosphere. This atmosphere is preferably generated in a defined, sealed spatial section, in the bonding chamber.

Although the method according to the invention should preferably be carried out in a low-pressure atmosphere, preferably in a vacuum, it may be advantageous to carry out the bonding process in another atmosphere, in particular in the region of normal pressure or at excess pressure.

As a result of the point-like contact, the bonding wave in the bonding according to the invention always runs radially symmetrical from the centre to the side edge and, in this process, pushes an annular gas cushion ahead of it. A bonding force prevails along the, in particular approximately circular ring-shaped, bonding line (bond front) of the bonding wave, said bonding force being so great that inclusions of gas bubbles can scarcely even arise. The upper/second substrate therefore lies on a kind of gas cushion during the bonding process. The character and resistance of the gas cushion is influenced by the embodiments.

All the aforementioned embodiments according to the invention can be carried out in a special variant of embodiment in a low vacuum, preferably in a high vacuum, still more preferably in an ultrahigh vacuum, especially at a pressure of less than 100 mbar, preferably less than $10^{-1}$ mbar, more preferably less than $10^{-3}$ mbar, still more preferably less than $10^{-5}$ mbar, most preferably of all less than $10^{-8}$ mbar. Further embodiments can be implemented at normal pressure (atmospheric pressure) or at an excess pressure.

In a further embodiment according to the invention, the gas cushion can be counteracted locally and dynamically by a pressure increase, so that the advance and the propagation of the bonding wave are in particular slowed down or hindered with a constantly increasing counter-pressure.

Alternatively, a pressure reduction for the acceleration of the bonding wave is possible in another embodiment according to the invention.

The time sequence of the course of the bonding wave is influenced in particular by the change in the pressure, so that there is a correlation between the course of the bonding wave and the change in pressure.

A relationship of an increasing (counter-)pressure with time is thus intended to be created, which can be described mathematically as a function. For the hindering of the bonding wave according to the invention, the function of the pressure (also referred to as the pressure gradient) in the bonding chamber, in particular between the substrates, should be able to be described by strictly monotonically increasing functions, which can be used for the retardation of the bonding wave. For the acceleration, it correspondingly applies that the pressure gradient should be able to be described by strictly monotonically falling or constant functions.

This change in pressure in the unit of time amounts to more than 1 mbar/s, preferably more than 10 mbar/s, more preferably more than 100 mbar/s, still more preferably more than 500 mbar/s, again more preferably more than 1000 mbar/s, in the ideal case more than 2000 mbar/s. A particularly important idea according to the invention lies in the rapidly and reproducibly variable bonding chamber pressure or gas composition between ultrahigh vacuum and excess vacuum.

By the inventive selection of a gas/gas mixture and the definition of the properties of the gas cushion, it is established how fast and how much the second substrate can be lowered and/or stretched. Furthermore, the speed of the bonding wave can also be controlled via the properties of the gas.

According to a further, in particular independent, aspect of the invention, the composition of the gas mixture is selected. Gases with types of atoms and/or molecules that are as light as possible are preferably used, which have a correspondingly small inertia at a given temperature. In particular, inert gases and/or weakly reacting gases are preferably used. One of the following gases or gas mixtures is particularly preferably used.

Inert gases and weakly reactive gases, in particular
  Nitrogen, argon, helium, carbon dioxide
Reactive gases, in particular
  Hydrogen, carbon monoxide, ammonia, water vapour, oxygen The molar mass of at least one of the gas components is therefore less than 1000 g/mol, preferably less than 100 g/mol, more preferably less than 10 g/mol, most preferably of all less than 1 g/mol. Also preferably, the density of the gas mixture used is adjusted, in particular, as low as possible and/or the temperature, in particular, as high as necessary. According to the invention, the gas density is less than 10 kg/m$^3$, preferably less than 1 kg/m$^3$, more preferably less than 0.1 kg/m$^3$, most preferably of all greater than 0.01 kg/m$^3$. According to the invention, the temperature of the gas is greater than $-100°$ C., preferably greater than $-50°$ C., still more preferably greater than $0°$ C., again still more preferably greater than $100°$ C., again still more preferably greater than $200°$ C., most preferably greater than $300°$ C., most preferably of all greater than $400°$ C.

According to the invention, the aforementioned parameters are selected such that the selected gas mixture or individual components of the gas mixture do not condense. Liquid inclusions at the surface of the substrates are thus prevented during the bonding process.

Similar considerations apply to gas mixtures, the thermodynamic properties of which are represented in multi-component phase diagrams. The kinematics of the first and/or second substrate is influenced by the change in composition and/or pressure and/or temperature of the gas mixture and, therefore, the "run-out" error is also reduced.

A further, in particular independent, aspect of the invention comprises the deformation of the first substrate and/or the second substrate being controlled in dependence on predefined influencing factors on the course of the bonding wave. The influencing factors include, amongst others, the ambient pressure of the atmosphere surrounding the substrates, the nature of the gas/gas mixture present in the atmosphere, the temperature, the spacing between the substrates outside the bond initiation point, the bonding strength of the substrates, any preliminary treatment steps, the nature of the surfaces, the surface roughness, the materials at the surface as well as wafer thickness/flexural stiffness.

If the bond initiation point is arranged in the centre of the contact faces of the substrates, a uniform, in particular concentric, course of the bonding wave can be achieved.

It is particularly advantageous if the deformation of the first substrate and/or of the second substrate takes place in the lateral direction and/or in a convex and/or concave manner, still more preferably mirror-symmetrically. In other words, according to the invention the deformation takes place in particular through stretching or compressing or bending of the first substrate and/or the second substrate.

The substrates preferably have approximately identical diameters, which in particular diverge from one another by less than 5 mm, preferably less than 3 mm, still more preferably less than 1 mm.

The holding and fixing of the substrates on holding devices can take place in any conceivable manner using any known technology. According to the invention, vacuum sample holders, electrostatic sample holders, sample holders with mechanical clamping are in particular conceivable. The substrates are preferably fixed only at a circle segment lying as far outward as possible in the region of the side edge, in order to endow the substrates with the greatest possible flexibility and freedom for expansion inside the fixing.

The substrates (wafers) are aligned with one another before the bonding process in order to ensure congruence (exact alignment, in particular with an accuracy of less than 2 μm, preferably less than 250 nm, still more preferably less than 150 nm, most preferably less than 100 nm, in the optimum case less than 50 nm) of corresponding structures on the surfaces. In the bonding process according to the invention, the wafers are not placed in a plane manner on one another, but rather are first brought into contact with one another in the centre, in that one of the two wafers is pressed slightly against the second wafer or is correspondingly deformed in the direction of the opposite-lying wafer. Following the release of the deformed (in the direction of the opposite-lying wafer) curved wafer, continuous and more uniform, in particular at least predominantly automatic, welding takes place along the bond front with the least possible force, and therefore with the least possible, predominantly horizontal, distortions associated therewith, as a result of the advance of the bonding wave All the variable parameters are particularly preferably selected such that the bonding wave is propagated with an optimum possible speed with respect to the initial conditions and boundary conditions present. A speed of the bonding wave as slow as possible is advantageous particularly in the presence of an atmosphere, especially at normal pressure. The speed of the bonding wave is less than 50 cm/s, more preferably less than 10 cm/s, more preferably less than 1 cm/s, most preferably less than 0.1 cm/s, most preferably of all less than 0.01 cm/s. In particular, the speed of the bonding wave is less than 0.001 cm/s. In particular, the speed of the bonding wave is constant along the bond front. The speed of the bonding wave is automatically faster in a vacuum environment, since the substrates bonding along the bonding line do not have to overcome any resistance due to a gas. A particularly preferred embodiment counteracts this acceleration of the bonding wave with the targeted use of the excess pressure and retards the speed of the bonding wave by more than 0.1 cm/s, preferably by more than 1 cm/s, more preferably by more than 10 cm/s, especially preferably by more than 100 cm/s, in the optimum case by more than 200 cm/s, in the ideal case by 1000 cm/s, the propagation of the bonding wave being able to be stopped, in the theoretical case, by the excess pressure (until a technologically/materially determined limiting pressure is reached).

According to a further, in particular independent, aspect of the invention, the "run-out" error is stopped by a very small spacing between the two substrates before the contacting and/or outside the bond initiation point. The spacing amounts in particular to less than 100 μm, preferably less than 50 μm, more preferably less than 20 μm, most preferably less than 10 μm.

A gas volume to be displaced can be estimated by the adjustment of the spacing. For this purpose, the substrates can be regarded as infinitely stiff plates. This characteristic volume includes the area of a first substrate to be bonded or of a second substrate (A1 or A2), times the spacing (h) of the substrates from one another. The displacement volume is demarcated in virtual of terms by the external periphery of the substrate stack. This approximately cylindrical virtual area represents a limit (M, M', M") of the gas flow, where the gas cushion is pushed into the bonding chamber by the bonding wave and/or the gas flows out and/or is sucked out.

The maximum spacing before the initiation of the pre-bond can amount to less than 1000 μm, preferably less than 500 μm, particularly preferably less than 200 μm, still more preferably less than 100 μm, in the particularly preferred case less than 50 μm.

Corresponding to these spacings, a displacement volume less than 31 ml, preferably less than 16 ml, more preferably less than 6 ml, particularly preferably less than 3 ml, most preferably of all less than 2 ml is set with a substrate diameter of 200 mm.

A displacement volume less than 71 ml, preferably less than 35 ml, still more preferably less than 14 ml, particularly preferably less than 7 ml, most preferably of all less than 4 ml is set with a substrate diameter of 300 mm.

The control and/or regulation of the steps and/or movements and/or sequences described above, in particular the approach of the substrates towards one another, the temperature control, pressure control and gas composition control, preferably takes place by means of a central control unit, in particular a computer with control software.

The use of suitable sensors for application in an electrically and/or electronically operated, in particular closed, control circuit or control circuits is required for regulation. These sensors are used in order to enable picking-up and/or processing and/or relaying of the respective influencing factors to be measured or their combinations. The sensors are able to detect in the bonding chamber, in particular, temperature, pressure, gas composition, deformation, particle number, alignment state of the substrates, position, speed and course of the bonding wave.

Accordingly, use can be made of thermometers, pressure sensors, gas chromatographers, expansion and deformation measuring devices, particle counters, optical and magnifying optical instruments (measuring microscopes) with image pick-up functions, position detection systems (tactile and/or capacitive and/or inductive or optical-incremental and completely optical contactless, such as camera systems, laser triangulation or laser interferometer systems).

After the detection, a computer with suitable equipment in terms of measurement acquisition, analysis and display facilities can be used to deliver statistics, evaluations and prognoses from individual values.

According to the invention, the statistics or analysis is used to adjust and readjust the bonding parameters, in particular for the preparation of the use of the device in production, which can be referred to as HVM (high-volume manufacturing).

A possible sequence of the steps according to the invention can comprise the following steps:

In a first (iterative) process step according to the invention, a specified number n of substrates are jointed to form n/2 test substrate pairs.

In a second (iterative) process step according to the invention, the test substrate pairs are measured and analysed in a suitable measuring unit for run-out.

In a third (iterative) process step according to the invention, the statistics of the run-out are calibrated with the statistics of the bonding parameters.

In a fourth (iterative) process step according to the invention, the target-orientated parameters are adjusted in a manner known to the person skilled in the art both with regard to alignment, as well as to influencing the bonding wave.

The iterations are repeated until a defined error or termination criterion is fallen below.

In a fifth process step according to the invention, the device can be cleared for production.

Features disclosed according to the device should also be deemed to be disclosed as according to the method and vice versa.

Further advantages, features and details of the invention emerge from the following description of preferred examples of embodiment and with the aid of the drawings.

BRIEF DESCRIPTIONS OF THE DRAWINGS

Figure 2B:
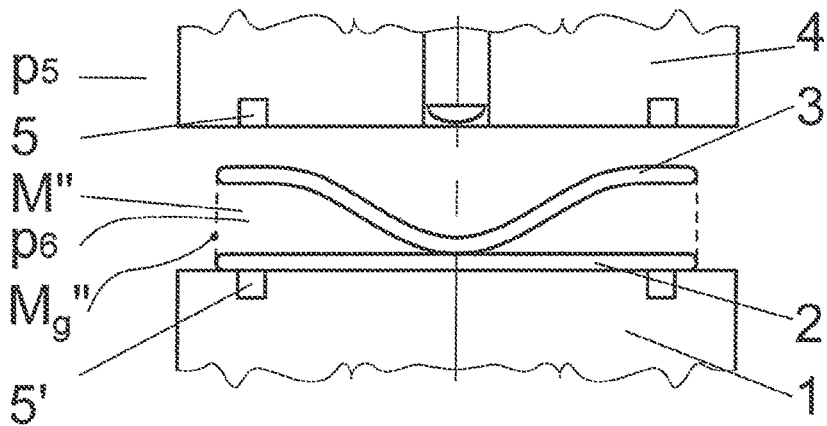
Figure 3:
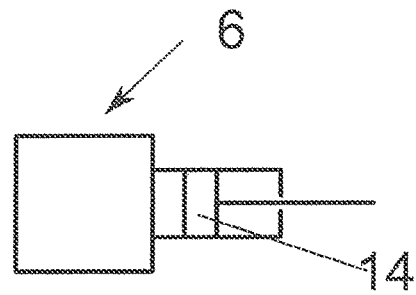
Figure 4:
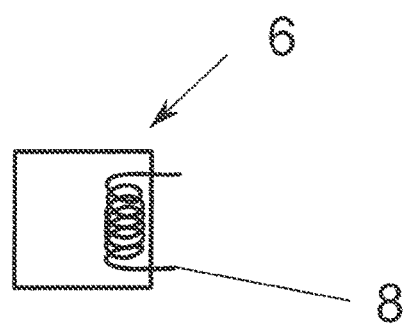
Figure 5:
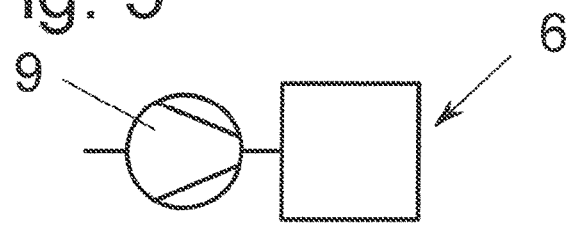
Figure 6:
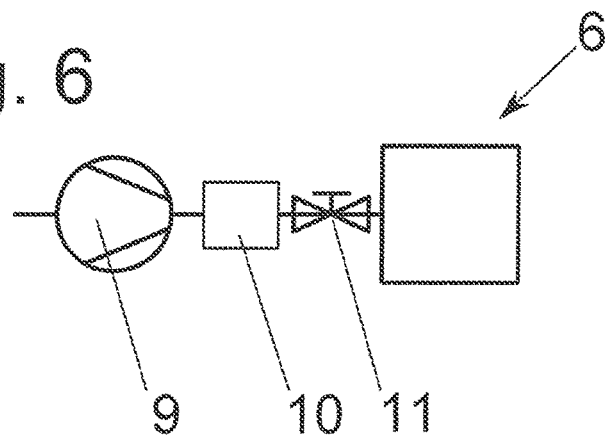
Figure 7:
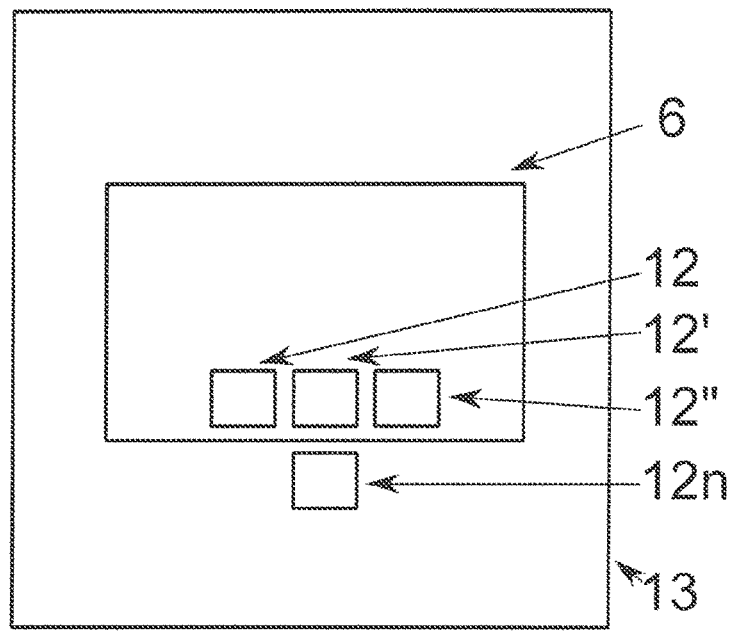

FIG. 1 shows a diagrammatic cross-sectional view of a bonding chamber according to the invention during a first step of a method according to the invention, FIG. 2a shows a diagrammatic cross-sectional view of the bonding process during a second step, FIG. 2b shows a diagrammatic cross-sectional view of the bonding process during a third step, FIG. 3 shows a diagrammatic cross-sectional view of a further embodiment of a bonding chamber according to the invention, FIG. 4 shows a diagrammatic cross-sectional view of a further embodiment of a bonding chamber according to the invention, FIG. 5 shows a diagrammatic cross-sectional view of a further embodiment of a bonding chamber according to the invention, FIG. 6 shows a diagrammatic cross-sectional view of a further embodiment of a bonding chamber according to the invention, FIG. 7 shows a schematic block diagram of a further bonding chamber according to the invention, FIG. 8 shows a diagram which represents the temporal sequence of a pressure course.

Identical components and components with the same function are denoted by the same reference numbers in the figures.

DETAILED DESCRIPTION OF THE INVENTION

FIG. 1 represents diagrammatically a bonding chamber 6 according to the invention, according to an exemplary embodiment, during a first step of an exemplary method according to the invention. The direction of gravitation g is represented. Located in bonding chamber 6 is a lower substrate holder, also referred to as chuck 1, with a functional surface 1o, which can have a radius of curvature R1. Furthermore, fixing means 5' are provided on/at the functional surface, in particular vacuum tracks for fixing lower substrate 2. The lower substrate is located with an outer surface 2a on functional surface 1o of lower substrate holder 1. Inner substrate surface 2i to be bonded is constituted with the preferred point of the future bond initiation point as first contact point K1. Upper substrate 3 is located at a distance h from lower substrate 2. Inner surface 3i of upper substrate 3 to be bonded lies opposite inner surface 2i of lower substrate 2 to be bonded. The contact point of the bond initiation point of upper substrate 3 is represented as second contact point K2. Upper substrate 3 is held at an outer surface 3a to functional surface 4o of an upper substrate holder 4 by fixing means 5. Due to the effect of gravitation, upper substrate 3 sags in a manner known to the person skilled in the art, which can be described approximately by radii R2, R3. A spatial section M is constituted between lower substrate 2 and upper substrate 3. A pressure p1 prevails inside spatial section M, a pressure p2 being able to be observed in the bonding chamber outside spatial section M. A spatial section interface Mg of spatial section M is defined as an observation face. A pin 7 initiates the bonding wave.

FIG. 2a represents a diagrammatic illustration of the bonding chamber during a bonding process. The two substrate holders 1 and 4 have been approached towards one another by positioning means not shown, to an extent such that contact points K1 and K2 meet one another. The bonding wave is able to propagate between inner surfaces 2i and 3i of substrates 2 and 3 to be bonded. A pressure p4 is observed inside spatial section M'. Outside spatial section M', a pressure p3 is influenced by means not shown, wherein this takes place locally, in particular in an annular manner at a spatial section interface Mg' of spatial section M' with an effect on and change to p4. As a result of the use of influencing means, in particular nozzles, the pressure in the whole spatial section M' cannot be changed abruptly, but rather has to change in time and locally over spatial section M'. A homogeneous pressure distribution does not therefore exist, at least at the beginning. The pressure distribution is generally, in particular at the beginning of the process, a function of place and time. If the influencing means are nozzles, which are located outside spatial section M' and act on spatial section face Mg', an isobaric region constituted in an annular form can be generated, which exists for a small unit of time, in particular an infinitesimally small unit of time. The unit of time is in particular less than 1 s, preferably less than 0.1 s, still more preferably less than 0.01 s, most preferably less than 0.0001 s, most preferably of all less than 0.00001 s. The pressure distribution can thus be graphically represented/simulated/calculated at a given point in time, in particular by an isobaric chart.

FIG. 2b represents a further diagrammatic illustration of bonding chamber 6 during a further step of the bonding process. Upper substrate 3 is dropped down from upper substrate holder 4 by releasing fixing means 5. Optionally, lower substrate 2 can also be freely deformed by releasing fixing means 5' and thus minimise the distortion. A pressure p6 is observed inside a spatial section M". Outside spatial section M", a pressure p5 is influenced by means not shown, wherein this takes place locally, in particular in an annular manner, at a spatial section interface Mg" of spatial section M" with an effect on and change to p6.

The advance of the bonding wave can in particular be retarded by the inventive, local and dynamic increase in pressure p5. A stationary state with a homogeneous pressure would accelerate the bonding wave, since the effort to fit more snugly together increases due to the substrate sections of the stack already bonded together. The greater the effort of the substrates to bond with each other, the greater would also be the force to separate themselves from one another again. If p6 is less than p5, the bonding wave would be accelerated. If the pressure increase of p5 at spatial section interface Mg" takes place dynamically, so that p6, through the pressure difference between p5 and p6, is higher than p5, the bonding wave will be retarded. In other words, it is the case that, when p6 is greater than p5, the bonding wave is retarded.

FIG. 3 represents a schematic block diagram of a first embodiment of a bonding chamber 6, wherein the in particular dynamic and constant increase in the chamber pressure takes place by means of a change in the bonding chamber volume, in particular by means of piston 14, so that the number of particles in bonding chamber 6 during the bonding process remains constant with changing pressure in an observation period, in particular between the end positions (not shown) of the piston. When there is a change in the volume of the sealed bonding chamber, no gas particles accordingly enter into the sealed system of the bonding chamber volume; likewise, no particles are removed. The particle number thus remains constant and the gas laws for ideal gases can thus be applied. In the embodiment, a targeted supply of the generated excess pressure in the case of a compression is to be conveyed via, for example, a nozzle system, described in FIG. 2, to the appropriate point.

FIG. 4 is a schematic block diagram of a second embodiment of a bonding chamber 6. The inventive increase in the pressure takes place via the change, in particular the increase, in the temperature by suitable heating means 8. The number of particles in bonding chamber 6 during the bonding process can remain constant with a sealed system. With a temperature change of the sealed bonding chamber, no gas particles accordingly enter into the sealed system of the bonding chamber volume; likewise, no particles are removed. The particle number thus remains constant and the gas laws for ideal gases can thus be applied. In the embodiment, a targeted supply of the generated excess pressure (generated by a thermal energy supply) is to be conveyed via, for example, a nozzle system, described in FIG. 2, to the appropriate point.

FIG. 5 is a schematic block diagram of a third embodiment of a bonding chamber 6 according to the invention, wherein the in particular dynamic and constant increase in the chamber pressure can take place by suitable compressor units 9, pumps. Particle-free air, nitrogen, argon, helium, carbon dioxide or other inert gases can be pumped at high pressure into the bonding chamber. As discussed in FIG. 2, and not shown here, a targeted supply of the generated excess pressure can influence the bonding wave, according to the invention, via a suitable nozzle system.

FIG. 6 represents an extension of the third embodiment of a bonding chamber 6 represented in FIG. 5. Here, an excess pressure is generated by means of a compressor unit 9, which fills a storage unit 10, in particular a pressure vessel. By means of suitable valves 11, the excess pressure can also be conveyed, as disclosed in FIG. 2a, 2b, to the appropriate points of spatial section interface Mg' or Mg" and the bonding wave can be influenced locally by means of a nozzle system. According to the invention, the introduction of the gas preferably takes place in the vicinity of the bonding interface, so that the abruptly inflowing gas generates an excess pressure p4 corresponding to FIG. 2a. Excess pressure p4 differs at least for a short period of time from pressure p3 and thus influences the bonding wave speed.

The nozzle system generally comprises at least two nozzles, preferably more than 3 nozzles, more preferably more than 5 nozzles, more than 7 nozzles, more than 10 nozzles. The nozzles are preferably arranged symmetrically around the entire circumference.

In a further embodiment according to the invention, use is made of a nozzle with a slit running at the circumference, which in particular can be constituted closed all around, i.e. around the entire circumference. Advantageous flow conditions can thus be generated at respective spatial section M, M', M".

If, in a further advantageous embodiment according to the invention, more than one slit nozzle is used, the partial pressure of a given supplied gas in the chamber can be adjusted by different gas supply lines and different process gases. The sum of all the partial pressures produces the bonding chamber pressure. It may be conceivable to convey into the bonding chamber not only inert gases, but rather reactive gases such as water vapour, hydrocarbons, fluorinated hydrocarbons, silanes, fluorinated silanes. Thus, for example, the prevention of condensation from mono-layers of water is possible or, in special cases, the saturation of the atmosphere with a supplied gas can be achieved.

Another aim may be to achieve an enhanced adhesive property of the bond by means of the gases.

In a first embodiment, the number of slit nozzles is precisely one, in another embodiment there are more than one slit nozzle present, for example precisely two slit nozzles. The number of slit nozzles can however amount to more than two, in another embodiment of more than three, in a particularly preferred embodiment more than five slit nozzles.

FIG. 7 is a schematic block diagram of a bonding device 13, which comprises at least one bonding chamber 6. Bonding chamber 6 can comprise a number of sensors 12, 12', 12", 12n, wherein n describes the number of sensors used. More than 2, preferably more than 5, still more preferably more than 10, most preferably more than 20 sensors can be arranged in the bonding chamber. The sensors can be combined to form clusters. Sensors 12 and/or 12' and/or 12" can represent a collection of a number of arbitrary n different sensors. Target-orientated positioning of all sensors 12 in device 13 and in bonding chamber 6 is permissible, so that sensors represented as 12n in the device can also be located in bonding chamber 6. The sensors are able to pick up the values and processes in the bonding chamber and in bonding device 13 and to relay the latter to computing units (not represented), further systems, in particular computers, for analysis, data evaluation, error analysis and prognoses. A control loop comprising measuring systems and bonding systems for high-volume manufacture, constituted in a manner known to the person skilled in the art, is also conceivable.

FIG. 8 represents, by way of example, a diagram of the temporal course of the pressure during the bonding process, in particular fusion bonding. It is preferably the case for the functions according to the invention that the latter (in the observation period) are strictly continuously monotonically increasing. Two exemplary curves are plotted for the pressure course, a continuous curve representing a linear function, a second curve, represented with a dashed line, representing an exponential function. In other words, the derivative of the function dp/dt should be positive at any given point in time tin the observation interval.

tn0 represents an arbitrary starting point of the observation, tn1 represents a technologically relevant subsequent point in time.

t the start of the observation, a pressure pn0 can be registered, in particular in observation volume M, M', M". In the case of the bonding taking place according to the invention, a higher pressure pn1 at point in time tn1 is observed in bonding chamber 6, in particular in virtual observation volume M, M', M", which higher pressure is described by means of any strictly continuously monotonically increasing function.

In special embodiments according to the invention, it may be necessary not to allow the pressure to increase strictly monotonically, but rather to keep it constant. In particular, it is also possible to keep the pressure constant from a certain point in time, i.e. no longer to allow it to increase monotonically.

LIST OF REFERENCE NUMBERS

1 First, in particular lower holding device, substrate holder
1o Functional surface of the first holding device
2 First, in particular lower substrate
2a Outer surface of the first substrate
2i Inner surface of the first substrate to be bonded
K1, K2 Contact points
3 Second, in particular upper substrate
3i Inner surface of the second substrate to be bonded
3a Outer surface of the second substrate
4 Second, in particular upper holding device, substrate holder
4o Functional surface of the second holding device
5, 5' Fixing means
6 Bonding chamber
7 Pin for initiating the bond
D1, D2 Diameter of the substrates
g Effective direction of gravitation
R1 Radius of the first substrate holder
R2, R3 Radii of the sag
h Spacing of the substrates from one another
M, M', M" Spatial section
Mg, Mg', Mg" Spatial section interface
p1, p2, p3, p4, p5, p6 pressure
8 heating device
9 Compressor
10 Pressure vessel
11 Valve
12, 12', 12", 12n Sensors and/or measuring instruments
13 Device for bonding
14 Piston
p Pressure
dp Pressure difference
dt Time difference
t Time
pn0, pn1 Pressures at different observation times
tn0, tn1 Observation times

What is claimed is:

1. A method for bonding a first substrate with a second substrate inside a sealed bonding chamber, said method comprising:
   a) fixing of the first and second substrates to respective first and second holding devices;
   b) arranging of the first and second substrates relative to each other;
   c) mutual approaching of the first and second substrates toward each other;
   d) contacting the first substrate with the second substrate at a bond initiation point;
   e) generating a bonding wave advancing from the bond initiation point to side edges of the first and second substrates;
   f) influencing the bonding wave during advancing of the bonding wave, wherein the influencing of the bonding wave includes a change in an atmosphere inside the bonding chamber; and
   g) introducing an inert gas or a slightly reactive gas into the bonding chamber.

2. The method according to claim 1, wherein said bonding is fusion bonding.

3. The method according to claim 1, wherein the introducing of the inert gas or the slightly reactive gas includes the use of a nozzle.

4. The method according to claim 1, wherein the inert gas or the slightly reactive gas includes nitrogen, argon, helium and/or carbon dioxide.

5. A device for the bonding of a first substrate with a second substrate, said device comprising:
   a sealed bonding chamber;
   first and second holding devices for respectively holding and fixing the first and second substrates, wherein the first and second holding devices are configured for mutual approaching of the first and second substrates toward each other, for contacting of the first and second substrates at a bond initiation point and for generating a bonding wave advancing from the bond initiation point to side edges of the first and second substrates; and
   influencing means for influencing the bonding wave during the advancing of the bonding wave, wherein the influencing means include means for changing the atmosphere inside the bonding chamber; and
   means for introducing an inert gas or a slightly reactive gas into the bonding chamber.

6. The device according to claim 5, wherein said bonding is fusion bonding.

7. The device according to claim 5, wherein the means for introducing the inert gas or the slightly reactive gas into the bonding chamber includes a nozzle.

8. The device according to claim 5, wherein the inert gas or the slightly reactive gas includes nitrogen, argon, helium and/or carbon dioxide.

* * * * *